United States Patent [19]

Moyer

[11] 4,260,429
[45] Apr. 7, 1981

[54] ELECTRODE FOR PHOTOVOLTAIC CELL

[75] Inventor: Richard L. Moyer, Newark, Del.

[73] Assignee: Ses, Incorporated, Newark, Del.

[21] Appl. No.: 150,857

[22] Filed: May 19, 1980

Related U.S. Application Data

[63] Continuation of Ser. No. 68,791, Aug. 22, 1979, abandoned.

[51] Int. Cl.³ .............................................. H01L 31/04
[52] U.S. Cl. ................................. 136/256; 136/260; 136/261; 29/572; 357/30; 357/65; 357/67; 427/74; 427/117; 427/388.5
[58] Field of Search ................... 136/256, 260, 261; 357/30, 65, 67; 427/74, 117, 388 D; 29/572

[56] References Cited

U.S. PATENT DOCUMENTS

| | | | |
|---|---|---|---|
| 2,104,483 | 1/1938 | Hewitt | 136/256 |
| 3,376,163 | 4/1968 | Abrahamson | 136/260 |
| 3,442,007 | 5/1969 | Griffin et al. | 228/179 |
| 3,480,473 | 11/1969 | Tanos | 427/74 |
| 3,483,038 | 12/1969 | Hui et al. | 136/244 |
| 3,888,697 | 6/1975 | Bogus et al. | 136/260 |
| 3,978,333 | 8/1976 | Crisman et al. | 136/255 |
| 4,127,424 | 11/1978 | Ullery, Jr. | 136/244 |

OTHER PUBLICATIONS

Rep. Prog. Physics, vol. 41, pp. 1857-1873 (1978).
M. Savelli et al., "Problems of the $Cu_x/sCdS$ Cell", chap. 6 in Topics in Applied Physics, vol. 31, Solar Energy Conversion, (1969).

Primary Examiner—Aaron Weisstuch
Attorney, Agent, or Firm—Dean F. Vance

[57] ABSTRACT

In a photovoltaic cell which comprises a first electrode, a first layer of cadmium sulfide, a second layer of cuprous sulfide forming a barrier junction with said first layer, and a second electrode, the improvement wherein said second electrode is formed by coating a conducting metal wire with a solid polymer containing electrically conductive particles, and attaching the coated wire to the cuprous sulfide layer by the application of moderate heat and/or pressure.

44 Claims, 2 Drawing Figures

ELECTRODE FOR PHOTOVOLTAIC CELL

This application is a continuation of applicant's copending application Ser. No. 68,791, filed Aug. 22, 1979, now abandoned.

BACKGROUND OF THE INVENTION

1. Field of the Invention

This invention relates generally to photovoltaic solar cells and to a method of making the cells. More particularly, the invention relates to the preparation and attachment of the top grid electrode in a thin-film photovoltaic cell.

2. The Prior Art

Cadmium sulfide solar cells operate on the principle of converting light energy to electrical energy. These cells comprise a thin film of cadmium sulfide deposited on a bottom electrode. On one surface of the cadmium sulfide a film of copper sulfide is placed which forms a barrier junction between the films. Without going into an explanation of how it is generated, the incidence of light on the copper sulfide layer, or as some maintain, on the cadmium sulfide, effects a voltage between the cadmium sulfide layer and the copper sulfide layer. In order to collect this current from the cell, a "collector grid" is applied to the copper sulfide layer to form the top electrode. By connecting appropriate wires to the top and bottom electrodes, a circuit can be formed for the flow of electrical current.

In the early development of solar cells, a collector grid was applied to the copper sulfide layer of a cadmium sulfide solar cell by drawing stripes with a ruling pen using a silver paste as the ink. However, poor adhesion, wide lines, and irregularities in width of lines presented problems in light transmission and electrical conductivity. Improved collector grids are disclosed in U.S. Pat. Nos. 3,442,007; 3,888,697 and 3,978,333. However, these grids also suffer from a number of disadvantages. The process of U.S. Pat. No. 3,442,007 requires the application of relatively high temperatures and pressures in order to get proper adherence of the grid to the cuprous sulfide layer. When an adhesive is used to attach the grid, such as in U.S. Pat. No. 3,888,697, the adhesive defeats the purpose of the top collector grid in that it insulates the collector grid and interferes with the conduction of current from the barrier to the grid. An approach used by the Clevite Corporation was to dip a preformed grid in a conductive epoxy-gold adhesive mixture prior to attachment to the cell. This approach presented numerous fabrication problems since it was very difficult to handle thin preformed grids. Another problem with using typical adhesives is that they must be applied as a liquid and therefore present various fabrication problems. What is needed is a collector grid that can be easily formed and attached to the top layer of the solar cell without the necessity for using additional adhesives and without the need for applying excessive heat and pressure. It is also necessary that the grid be in good ohmic contact with the top layer.

SUMMARY OF THE INVENTION

The invention broadly comprises a novel electrode for use in a photovoltaic cell, said electrode comprising one or more conducting metal wires coated with a solid polymer containing electrically conductive particles. In a specific embodiment the present invention comprises a thin film, photovoltaic cell containing a novel electrode, said cell comprising:

(a) an electrically conductive first electrode;
(b) a film of a first semiconductor material of one type conductivity covering at least a portion of said first electrode;
(c) a film of a second semiconductor material of opposite type conductivity forming a p-n junction with the first semiconductor material; and
(d) a second electrode, in ohmic contact with said second semiconductor material and which allows radiant energy to pass into the second semiconductor material, said second electrode comprising a conducting metal wire coated with a solid polymer containing electrically conductive particles.

The second electrode is preferably formed by the process comprising:

(i) coating a conducting metal wire with a polymer containing electrically conductive particles; and
(ii) attaching said coated wire to said second semiconductor material by the application of heat and/or pressure.

The electrodes prepared according to the present invention have a number of advantages over the prior art. Of some significance, the present invention provides cells possessing a very large percentage of open space, therein maximizing area exposed to light, while still maintaining low sheet resistance loss. This is due to the ability to employ wires of very thin diameter having thin coatings of conductive polymer. Still further, another of the major advantages of the present cells is the ease of fabrication. The prior art use of liquid adhesives to attach the electrode presented numerous handling problems. The present process uses a solid polymer which makes handling of the electrode much simpler. Another advantage of the present invention is that it is an "open" grid system as opposed to some of the most common prior art grid systems. Previously, grids were formed by plating a metal grid onto a clear plastic sheet, such as an ACLAR ® film. This grid with plastic backing facing away from the uppermost semiconductor layer was then glued onto the cell. The presence of the sheet is not always desirable since it is often difficult to handle, e.g., the sheet is quite flexible and the grid is subject to breakage during handling, and it restricts the opportunity to employ antireflection layers and the like. Still another advantage of the present invention is that it comprises a low cost method to form a grid as opposed to the more complicated grids employed in the prior art.

Another advantage of the present invention lies in the potential for improved efficiency and performance. The efficiency of a grid system in collecting the output current of a solar cell is a complicated interplay of three factors: open area (for light transmission), uniformity losses, and inefficiencies of device operation called mismatch losses. The most efficient geometry for a particular device at a particular design operating point will depend on the device characteristics (local I-V relations, sheet resistivity of upper surface, and device length and width) as well as the limitations on wire resistance and width imposed by the grid technology. A parallel wire system for use on a uniform substrate involves, among other things, light transmission losses, sheet resistance mismatch losses and wire resistance mismatch losses. Ideally, the wires should be as narrow as possible (to minimize light transmission losses), as closely spaced as possible (to minimize sheet resistance mismatch losses), and as conductive as possible (to minimize wire resistance and mismatch losses). Any real grid system is a compromise between these factors that results in maximum power output under the design conditions. In addition, the variation in power output efficiency as a function of intensity and operating temperature must be considered, as these changes affect the weighting of the loss factors in a grid system. The technologies for making grids according to the present invention offer different limits for each of these compromises. In a design where wire length is large and sheet resistance mismatch low, the wire resistance/length may be of more consideration than the limit on a transmission and sheet resistance mismatch loss imposed by the minimum practicable wire width. Such is the case for $Cu_2S$-Cds solar cells with 10 cm or more grid line length, where alternative technologies (electroplated grids, photolithographic metal meshes, and mask-evaporated grids) all have high wire resistance loss terms. It is in just such cases that the "wire grid" technology of the present invention (with the lowest wire resistance/length) offers a particular advantage in performance over alternate technologies.

DETAILED DESCRIPTION OF THE INVENTION

Figure 1:
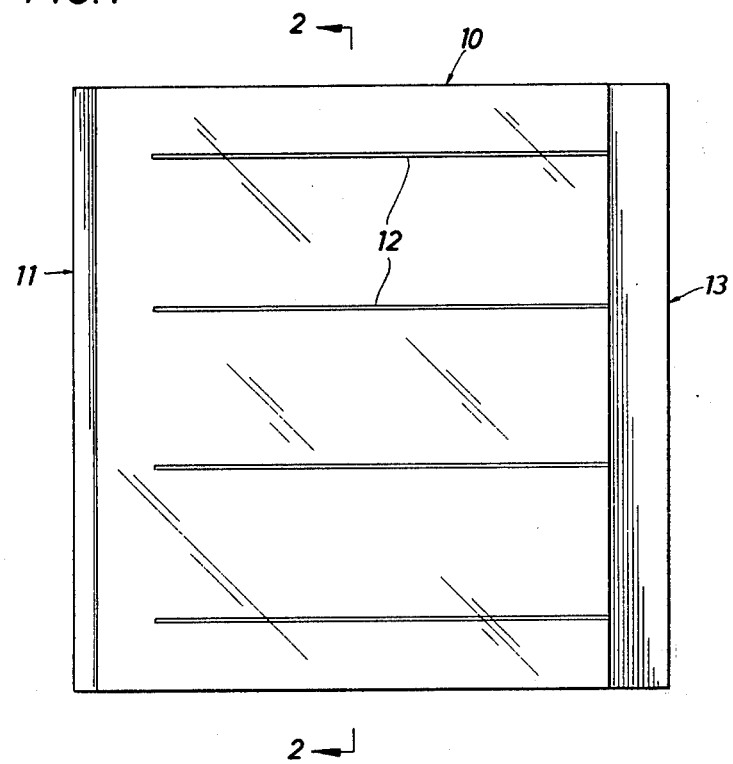
FIG. 1 is a top plan view of a cell made according to the present invention.

Referring to FIG. 1 of the drawing, 10 shows a single thin-film photovoltaic cell having a bottom electrode 11, and a top electrode 12, the wires of the top electrode terminating in a buss 13. Since as is commonly known, an individual solar cell generates only a small amount of power, usually much less power than is required for most applications, the desired voltage and current is realized by interconnecting a plurality of solar cells in a series and parallel matrix. This matrix is generally referred to as a solar cell array, and generates electrical energy from solar radiation for a variety of uses.

Figure 2:
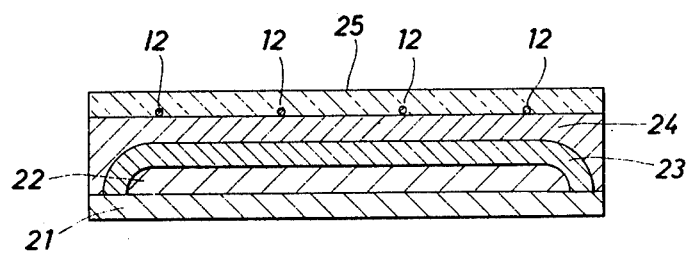
FIG. 2 is a cross-sectional view of the cell taking along line 2—2 of FIG. 1 showing the layers of the individual cell. This cross-sectional view is not to scale since it would not be practical to show in a drawing the true thickness of the electrode and cell elements.

The present invention deals specifically with the top electrode of the cell. FIG. 2 provides a cross sectional view of the cell taken along line 2—2. While the remainder of the description of the invention refers primarily to cadmium sulfide-type cells, the present invention also may be used with other types of solar cells, such as single crystal silicon solar cells or polycrystalline solar cells, such as those disclosed in U.S. Pat. No. 3,978,333.

The first step in forming a cell typically is to coat a non-conducting substrate 21 with a conductive layer to form the bottom electrode 22. Typical substrates include plastics, metals or ceramics. Various substrates are disclosed in U.S. Pat. Nos. 3,483,038, 3,376,163, and in 4,127,424. The bottom electrode or conductive layer typically comprises a conductive metal such as copper or silver. More than one layer of metal may be deposited on the substrate if desired. In some cases the substrate may also be the bottom electrode, e.g. a molybdenum substrate may also serve as the electrode. In addition, a thin film of an electrically conductive metal such as zinc may be applied to the electrode.

Upon this bottom electrode a semiconductor material such as cadmium sulfide film 23 is deposited. This can be done in a known manner, such as through a suitably apertured mask from the vapor state. The thickness of the layer is typically about 20 microns to about 100 microns. The cadmium sulfide film 23 typically covers and completely overlaps all but a small portion of the bottom electrode. The uncovered portion can be used subsequently either for electrical connecting means to an adjacent cell, such as the top electrode of an adjacent cell to make a series connection therewith, or for a negative output terminal. When the substrate is insulating, as shown, the cadmium sulfate film 23 in each of the cells typically overlaps the remaining periphery of the bottom electrode and extends to the surface of substrate 21 in order that the subsequent overlapping films and the top electrode in each cell do not contact the bottom electrode layer 22.

The surface of the cadmium sulfate film 23 may be etched with hydrochloric acid for about 4-5 seconds, if desired, before the cuprous sulfide film is formed therein, as described in U.S. Pat. No. 3,480,473. The cuprous sulfide film 24 is formed in a suitable fashion such as, for example, deposition from the vapor state through a suitably apertured mask over the cadmium sulfide film 23, or by contacting the cadmium sulfide film 23 with an aqueous solution of a cuprous salt as, for example, a cuprous chloride or bromide solution, as described in Keramidas, U.S. Pat. No. 3,374,108. The cuprous sulfide film 24 will typically have a thickness between about 1000 A and about 10,000 A.

In the present invention the top electrode comprises an electrically conductive metal wire coated with a polymer containing electrically conductive particles. This coated wire 12 is placed on the cuprous sulfide surface in the desired pattern and becomes attached to the cuprous sulfide layer by application of moderate heat and/or pressure to form the top electrode. Typical conducting metals used for the wire include gold, copper, nickel and silver. The term "wire" is used in its usual sense as an elongated, generally circular cross-sectioned, slender, usually flexible, metal having a diameter of between about 0.0001 inches and about 0.005 inches, preferably between about 0.001 inches and about 0.003 inches. Preferred is copper wire having a diameter of about 0.0025 inches.

An important aspect of the present invention is that the polymer coating must contain electrically conductive particles so as to permit transfer of the generated current between the conducting metal wire and the cuprous sulfide layer. Without the conductive particles, the polymer alone would act as an insulator and would result in much reduced power from the cell. Sufficient type and quantity of particles are required to provide ohmic contact between the metal wire and cuprous sulfide layer. As defined at page 416 of *Physics of Semiconductor Devices,* Wiley Interscience, New York 1969 by S. M. Sze, an ohmic contact is "a contact which will not add a significant parasitic impedance to the structure on which it is used, and it will not sufficiently change the equilibrium carrier densities within the semiconductor to affect the device characteristics." In practice, the above ideal ohmic contact can only be approximated. An ohmic contact can also be defined as a low resistance, non-rectifying type of contact. As for the relative amounts of polymer and particles, too small a quantity of particles results in little or no ohmic contact while too large a quantity of particles results in too little binder and the possibility of fabrication problems. The polymer coating of the wire in general contains between about 5 and 95 percent by weight electrically conductive particles, preferably between about 20 and about 80 percent by weight. Selection of the specific electrically conductive particle depends upon a number of factors including the composition of the top semiconductor layer and compatability with the polymer. Specific examples of particles that form ohmic contacts with various semiconductor materials are shown below in Table 1. Some of them may have to be alloyed with the semiconductor during the heat cycle.

TABLE 1

| Semiconductor | Type | Conductive Particle |
|---|---|---|
| Si | n | Au/Si |
|  |  | Au/Ge |
|  | n+ | Al |
|  | p | Al/Si |
|  |  | Ag |
| GaAs | n | Au/Ge |
|  |  | Au/Sn |
|  |  | Sn |
|  | p | Au/Zn |
|  |  | Au/Be |
| CdS | n | In |
|  |  | Ni |
|  |  | Ti/Al |
|  |  | Hg |
| $Cu_2S$ | p | Au |
|  |  | Graphite |
|  |  | Cu |
|  |  | Conductive Carbon Black |
|  |  | Pb/Sn |

When the top semiconductor layer is cuprous sulfide, preferred particles include conductive carbon black, crystalline graphite and gold. Crystalline graphite particles are particularly preferred, especially when the polymer coating is applied to the wire as a liquid suspension. One reason for this preference is that the crystalline graphite particles do not tend to cause agglomeration on the wire as do some conductive carbon blacks.

Suitable polymers employed in coating the wire may be either thermoplastic or thermosetting. These polymers preferably should be non-brittle, possess good ultraviolet resistance, be chemically non-poisonous and should adhere to the cuprous sulfide film upon application of moderate heat and pressure. Further, the polymer should be one into which the conductive particles may be adequately dispersed. Still further, suitable polymers are those which can be uniformly coated onto the wire. A preferred polymer is a fluoroelastomer material, such as that disclosed in U.S. Pat. Nos. 3,870,987, 3,661,831 and 3,900,654. Suitable fluoroelastomers include vinyl/olefinic fluoroelastomeric polymers, vinyl-fluorocarbon elastomeric copolymers, vinylidene/-fluoroolefinic elastomeric polymers, and $C_2$–$C_4$ olefinic/fluorocarbon elastomeric copolymers. A much preferred material is the vinylidene fluoride/hexafluoropropene copolymer fluoroelastomer. Commercially available fluoroelastomers include DuPont's VITON B polymer and 3M'S Fluorel polymer. These polymers are typically employed in a solution. Typical solvents include ketones such as methyl-ethyl ketone, acetone, dimethylformamide, isophorone, and the like. A much preferred solution of these polymers containing suspended graphite is available from Acheson Colloids Company under the tradename Electrodag +502 SS. This material contains about 10% by weight crystalline graphite, about 12% by weight VITON B polymer, about 78% by weight isophorone solvent and a curing agent. The VITON B polymer is a vinylidene fluoride/-hexafluoroprene copolymer fluoroelastomer.

The process employed for coating the wire with the polymer/conductive particle mixtures will vary depending upon the coating thickness required, type of polymer, type of conductive particle, relative amount of polymer/conductive particle, among other factors. For example, when the chosen polymer is a thermoplastic polymer, such as a styrene-diene block copolymer, selectively hydrogenated styrene-diene block copolymer, and the like, the polymer coating may be easily applied by known wire coating extrusion techniques. Alternatively, the thermoplastic polymer may be applied as a suspension by passing the wire through a suspension of particles in the polymer solution, running the coated wire through a die and then running the coated wire through an evaporator or drying oven to remove the solvent. When the polymer employed is a thermosetting polymer the coating technique employed is slightly more complex. Briefly, the wire is passed through a dispersion of the polymer/conducting particle mixture in a solvent, then passed through a die, and then passed through a heater or dryer to remove the solvent. Regarding thermosetting polymers, the temperature and conditions during the drying step should be sufficient to remove the solvent while not being so severe that the polymer becomes crosslinked or set. The final cure or crosslinking will occur after the coated wire is attached to the cell. By way of specific example, when employing the Acheson Electrodag solution, the wire is first passed through the solution, then run through a die and then dried or baked at a temperature of about 80°–95° C. for a short time, e.g. about 2 or 3 seconds. This may be repeated to produce a thicker coating if necessary. The curing of this resin requires the application of higher heat (about 200° C.) and a longer bake time (about 15 to 20 minutes.)

The polymer layer around the wire should be sufficiently thick to provide adhesion to the cell, while not being so thick as to unnecessarily reduce the area for light transmission. The polymer coating around the wire is preferably uniform having a thickness of between about 0.05 mils and about 1 mils, more preferably about 0.1 mils and about 0.4 mils.

One of the desireable features of the present invention is that the coated wire is dry to the touch and is easily handleable. For example, the coated wire may be wound on a spool and stored prior to fabrication of the top electrode on the cell. This is not possible with the prior art adhesive system, wherein the coated electrode could not be easily stored prior to attachment to the cell.

The coated wire is then placed on the cuprous sulfide layer to serve as the top electrode. The structure or form of the electrode may vary depending upon a number of factors. Useful electrode structures are disclosed in U.S. Pat. Nos. 3,442,007, 3,888,697 and 3,978,333. The top electrode may comprise simply a single wire running across the cell, a number of parallel wires running across the cell, or a number of wires woven into a matrix similar to that shown in U.S. Pat. No. 3,442,007. Other variations are also within the scope of the present invention. The solid polymeric coating on the wire permits the manufacturer to use a wide variety of techniques to form the top electrode. A simple procedure is merely to place the wires across the surface of the cells in a uniform parallel manner by use of a turning lathe.

The wires of the electrode are then attached to a buss or terminal, such as the buss 13 shown in FIG. 1.

In forming the top electrode it is important to retain as much open space as possible for the light to contact the cuprous sulfide layer. Ideally, maximum power is attained with maximum area exposed to light. However, multiple conductors are generally required to provide short current paths for collection of the current generated. About 80 to about 98 percent or more open space is preferred. Because of the ability to employ multiple thin wires coated with a thin polymer layer, it is possible to produce cells having a higher percentage of open space while maintaining low sheet resistance loss. Wire spacings of about 20 wires per inch to about 80 wires per inch are typical.

After the coated wire is placed on the cell, moderate heat and/or pressure are applied. The heat and pressure allow uniform contact with the cuprous sulfide layer along the wire, resulting in better ohmic contact with the cuprous sulfide film. When it is desired to crosslink a reactive elastomeric polymer, such as is the case when Acheson Electrodag is used, supplemental crosslinking agents may also be employed. Temperatures employed with the Acheson Electrodag are in general between about 150° C. and about 230° C., preferably between about 200° C. and about 210° C. Pressures with the Acheson Electrodag are in general between about 15 psi and about 100 psi, preferably between about 20 psi and about 75 psi. The appropriate temperature and pressure for each application depends primarily upon the particular polymer employed.

The finished cell assembly is then usually sealed with a protective light transmitting coating or a protective film or plate 25 of a material such as glass or the like. The protective film should be impervious to oxygen and water vapor which would degrade the cell.

In operation, the cell converts light into electrical energy when exposed to light. In each cell, light energy passes through the area not covered by top electrode wires to the cuprous sulfide film 24 where it is at least partially absorbed thereby producing a voltage between the bottom electrode and the top electrode. Since this voltage for a photovoltaic, cadmium sulfide cell is typically about 0.4–0.5 volts, cells are connected in series to provide a desired voltage. The current capacities at the desired voltage may be increased by connecting a plurality of the serially connected rows of cells in parallel.

What is claimed is:

1. A photovoltaic cell comprising:
   (a) an electrically conductive first electrode;
   (b) a film of a first semiconductor material of one type conductivity covering at least a portion of said first electrode;
   (c) a film of a second semiconductor material of opposite type conductivity overlying and forming a p-n junction with the first semiconductor material; and
   (d) a second electrode, in ohmic contact with said second semiconductor material and which allows radiant energy to pass into the second semiconductor material, said second electrode comprising one or more electrically conductive metal wires coated with a solid polymer containing electrically conductive particles.

2. A cell according to claim 1 wherein said first semiconductor material is cadmium sulfide and said second semiconductor material is cuprous sulfide.

3. A cell according to claims 1 or 2 wherein said conducting metal wire is a copper wire.

4. A cell according to claim 3 wherein said polymer is a vinylidene fluoride/hexafluoropropene copolymer.

5. A cell according to claim 4 wherein said conductive particles are crystalline graphite particles.

6. A cell according to claim 5 wherein the polymer coating contains between about 5 percent by weight and about 95 percent by weight crystalline graphite particles.

7. A cell according to claim 2 wherein said electrically conductive particles are selected from the group consisting of conductive carbon black, crystalline graphite, and gold.

8. A cell according to claim 1 wherein said polymer is a thermoplastic polymer.

9. A cell according to claim 1 wherein said polymer is a thermosetting polymer.

10. A silicon photovoltaic cell according to claim 1.

11. A cell according to claim 10 wherein said conducting metal wire is a copper wire.

12. A cell according to claim 11 wherein said polymer is a vinylidene fluoride/hexafluoropropene copolymer.

13. A cell according to claim 12 wherein said conductive carbon particles are crystalline graphite particles.

14. A cell according to claim 13 wherein the polymer contains between about 5 percent by weight and about 95 percent by weight crystalline graphite particles.

15. A cell according to claim 10 wherein said electrically conductive particles are selected from the group consisting of conductive carbon black, crystalline graphite, and gold.

16. A photovoltaic cell comprising:
   (a) an electrically conductive first electrode;
   (b) a film of a first semiconductor material of one type conductivity covering at least a portion of said first electrode;
   (c) a film of a second semiconductor material of opposite type conductivity overlying and forming a p-n junction with the first semiconductor material; and
   (d) a second electrode, in ohmic contact with said second semiconductor material and which allows radiant energy to pass into the second semiconductor material, said second electrode being formed by the process comprising:
      (i) coating an electrically conductive metal wire with a polymer containing electrically conductive particles; and
      (ii) attaching said coated wire to said second semiconductor material by the application of heat, pressure, or heat and pressure.

17. A cell according to claim 16 wherein said first semiconductor material is cadmium sulfide and said second semiconductor material is cuprous sulfide.

18. A cell according to claims 16 or 17 wherein said conducting metal wire is a copper wire.

19. A cell according to claim 18 wherein said polymer is a vinylidene fluoride/hexafluoropropene copolymer.

20. A cell according to claim 19 wherein said conductive carbon particles are crystalline graphite particles.

21. A cell according to claim 20 wherein the polymer contains between about 5 percent by weight and about 95 percent by weight crystalline graphite particles.

22. A cell according to claim 17 wherein said electrically conductive particles are selected from the group consisting of conductive carbon black, crystalline graphite, and gold.

23. An improvement in the process for forming and attaching an electrode for a photovoltaic cell, which improvement comprises:
(i) coating a conducting metal wire with a polymer containing electrically conductive particles;
(ii) attaching said coated wire to an outer semiconductor layer of said cell by the application of heat, pressure, or heat and pressure.

24. A process according to claim 23 wherein said photovoltaic cell is a cadmium sulfide/cuprous sulfide photovoltaic cell.

25. A process according to claim 24 wherein said polymer is a vinylidene fluoride/hexafluoropropene copolymer.

26. A process according to claim 25 wherein said conductive particles are crystalline graphite particles.

27. A process according to claim 26 wherein said wire is coated by passing the wire through a dispersion of said vinylidene fluoride/hexafluoropropene copolymer and said crystalline graphite particles in a carrier liquid, passing the resulting wire through a die so as to provide a uniform coating, and evaporating at least a substantial portion of said carrier liquid.

28. A process according to claim 27 wherein said carrier liquid is isophorone.

29. A process according to claim 27 wherein the evaporation is effected between about 80° and about 95° C.

30. A process according to claim 29 wherein said coated wire is attached to said cell by the application of heat in the range of about 150° C. to about 230° C. and external pressure in the range of about 15 psi to about 100 psi.

31. A process according to claim 23 wherein said photovoltaic cell is a silicon solar cell.

32. A process according to claim 23 wherein two or more coated wires are attached to said cell in parallel arrangement.

33. A process according to claim 23 wherein said polymer is a thermoplastic polymer.

34. A process according to claim 33 wherein said thermoplastic polymer containing conductive particles is extruded onto said wire so as to form said coated wire.

35. A cell produced according to the process of claim 23.

36. An improvement in the process of attaching an electrode to a photovoltaic cell, which improvement comprises attaching said electrode to an outer semiconductor layer of said cell by the application of heat, pressure, or heat and pressure, said electrode comprising an electrically conductive metal wire coated with a polymer containing electrically conductive particles.

37. A process according to claim 36 wherein said photovoltaic cell is a cadmium sulfide/cuprous sulfide photovoltaic cell.

38. A process according to claim 37 wherein said polymer is a vinylidene fluoride/hexafluoropropene copolymer.

39. A process according to claim 38 wherein said conductive particles are crystalline graphite particles.

40. A process according to claim 36 wherein said photovoltaic cell is a silicon solar cell.

41. A process according to claim 36 wherein said coated wire is attached to said cell by the application of heat in the range of about 150° C. to about 230° C. and external pressure in the range of about 15 psi to about 100 psi.

42. A process according to claim 36 wherein two or more coated wires are attached to said cell in parallel arrangement.

43. A process according to claim 36 wherein said polymer is a thermoplastic polymer.

44. A cell produced according to the process of claim 30.

* * * * *